United States Patent
Hirashima et al.

(10) Patent No.: US 12,020,772 B2
(45) Date of Patent: Jun. 25, 2024

(54) SEMICONDUCTOR MEMORY DEVICE WITH A VARIABLE DELAY FOR A DATA SELECT SIGNAL AND A COUNTER FOR COUNTING A SELECTED DATA SIGNAL DURING A TEST OPERATION

(71) Applicant: Kioxia Corporation, Tokyo (JP)

(72) Inventors: Yasuhiro Hirashima, Kawasaki Kanagawa (JP); Mitsuhiro Abe, Kawasaki Kanagawa (JP); Norichika Asaoka, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 21 days.

(21) Appl. No.: 17/716,295

(22) Filed: Apr. 8, 2022

(65) Prior Publication Data
US 2022/0230665 A1 Jul. 21, 2022

Related U.S. Application Data

(63) Continuation of application No. PCT/JP2019/040039, filed on Oct. 10, 2019.

(51) Int. Cl.
G11C 7/10 (2006.01)
G11C 29/12 (2006.01)

(52) U.S. Cl.
CPC .......... *G11C 7/1093* (2013.01); *G11C 7/1057* (2013.01); *G11C 7/1066* (2013.01); *G11C 7/1084* (2013.01); *G11C 29/1201* (2013.01)

(58) Field of Classification Search
None
See application file for complete search history.

(56) References Cited

U.S. PATENT DOCUMENTS

| 5,835,729 | A | * | 11/1998 | Moreton | ................. | H04N 9/78 348/664 |
| 6,075,392 | A | * | 6/2000 | Sandner | .................. | G06F 1/08 327/145 |
| 2007/0001724 | A1 | | 1/2007 | Na | | |
| 2007/0291830 | A1 | | 12/2007 | Hori | | |

(Continued)

FOREIGN PATENT DOCUMENTS

| JP | 2007317016 A | 12/2007 |
| JP | 2013165354 A | 8/2013 |

(Continued)

OTHER PUBLICATIONS

English Translation of an International Search Report dated Dec. 17, 2019, issued in International Application No. PCT/JP2019/040039.

*Primary Examiner* — J. H. Hur
(74) *Attorney, Agent, or Firm* — Holtz, Holtz & Volek PC

(57) ABSTRACT

A semiconductor memory device includes: a first delay circuit configured to delay a first signal and provide a variable delay time; a first select circuit configured to select a second signal or a third signal based on the first signal delayed by the first delay circuit; a first circuit configured to output a fourth signal based on a signal selected and output by the first select circuit; a first output buffer configured to output a fifth signal based on the signal selected and output by the first select circuit; a first output pad configured to externally output the fifth signal; and a counter configured to count a number of times the fourth signal is output.

5 Claims, 13 Drawing Sheets

(56) References Cited

U.S. PATENT DOCUMENTS

| | | |
|---|---|---|
| 2007/0300098 A1* | 12/2007 | Chen .................. G06F 1/12 |
| | | 713/401 |
| 2010/0287335 A1 | 11/2010 | Chung et al. |
| 2013/0207701 A1 | 8/2013 | Kitagawa |
| 2015/0358007 A1 | 12/2015 | Diffenderfer et al. |
| 2016/0225420 A1 | 8/2016 | Tang et al. |
| 2018/0061462 A1 | 3/2018 | Murakami et al. |

FOREIGN PATENT DOCUMENTS

| | | |
|---|---|---|
| JP | 2017525184 A | 8/2017 |
| TW | I321401 B | 3/2010 |

* cited by examiner

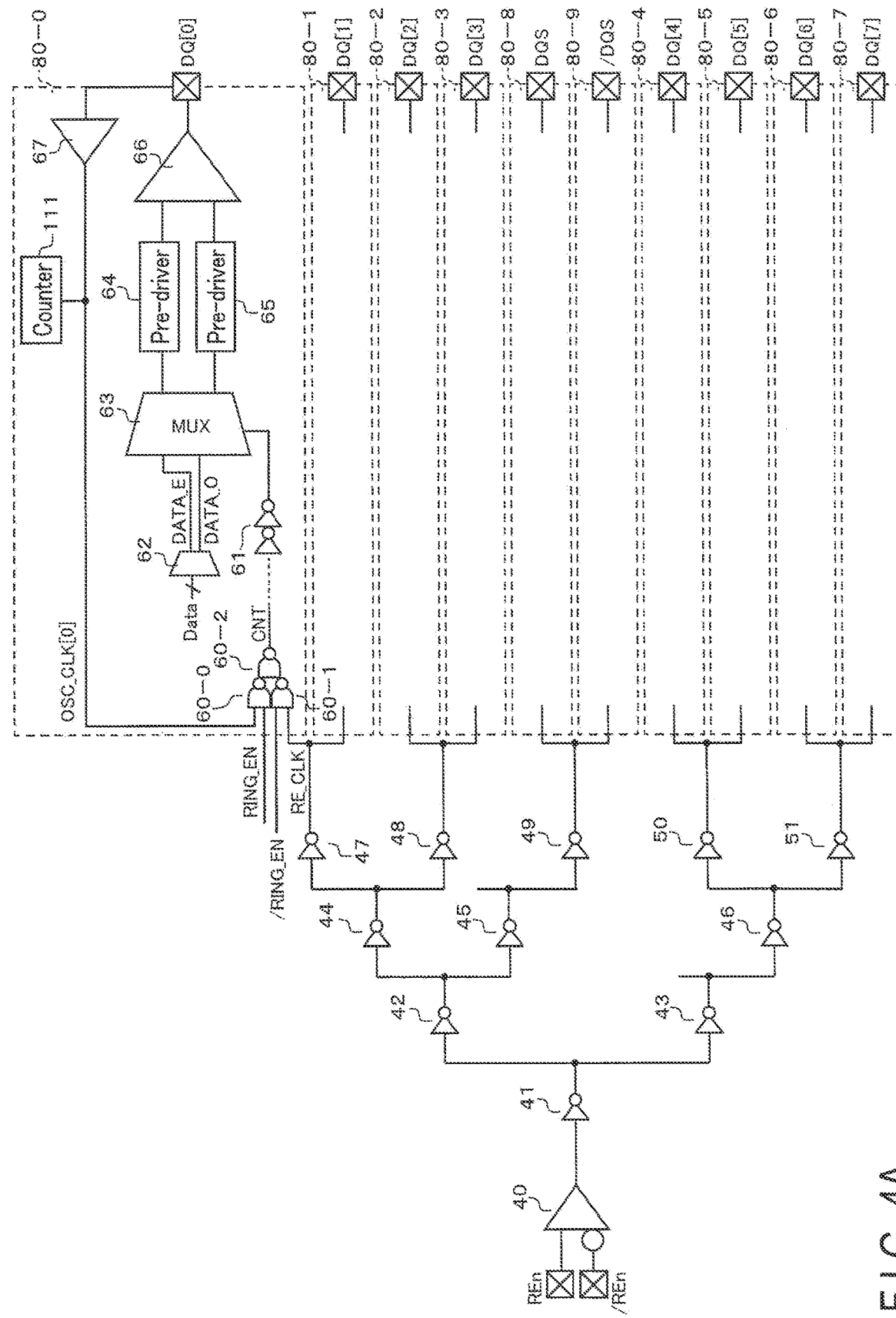
F I G. 4A

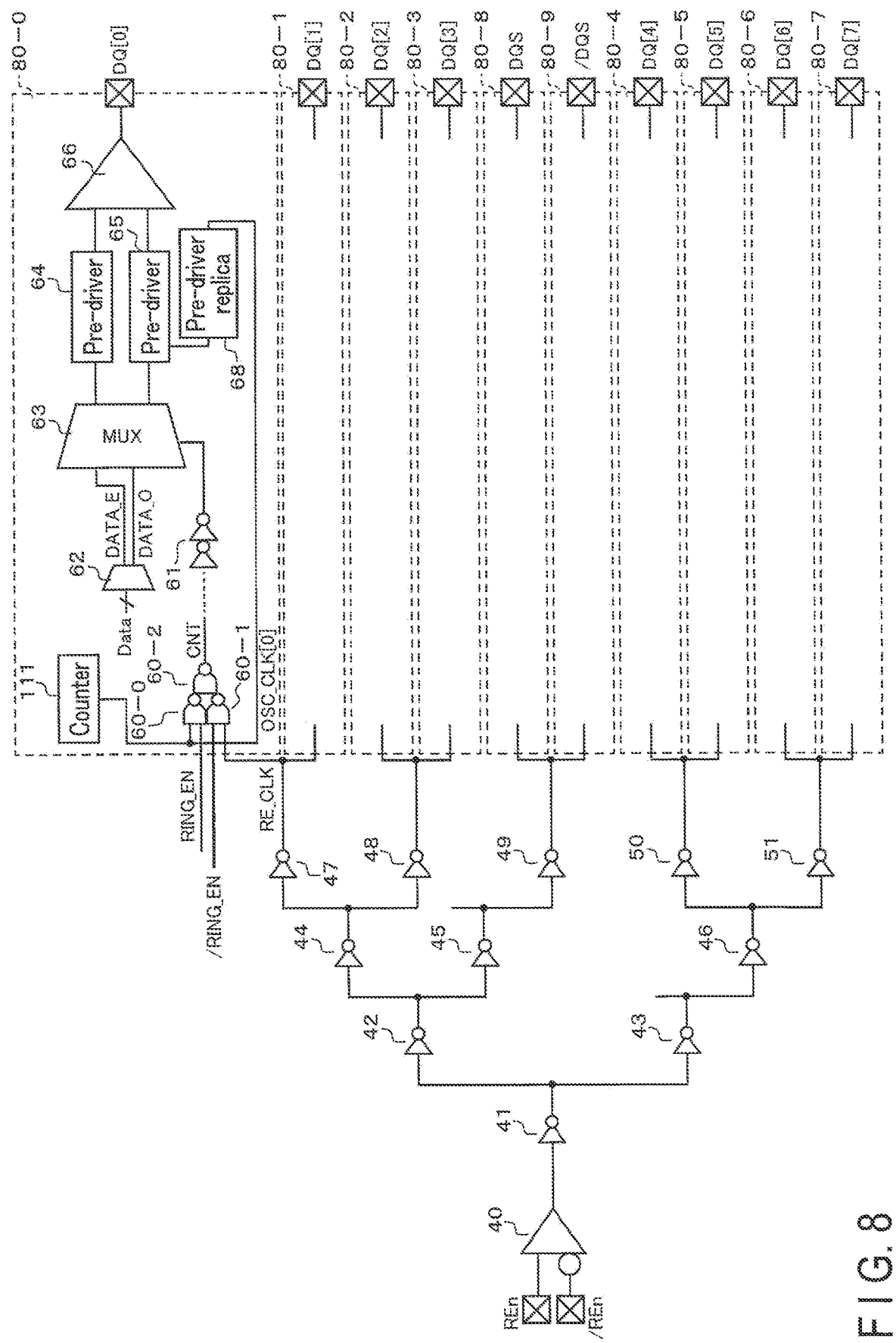
F I G. 8

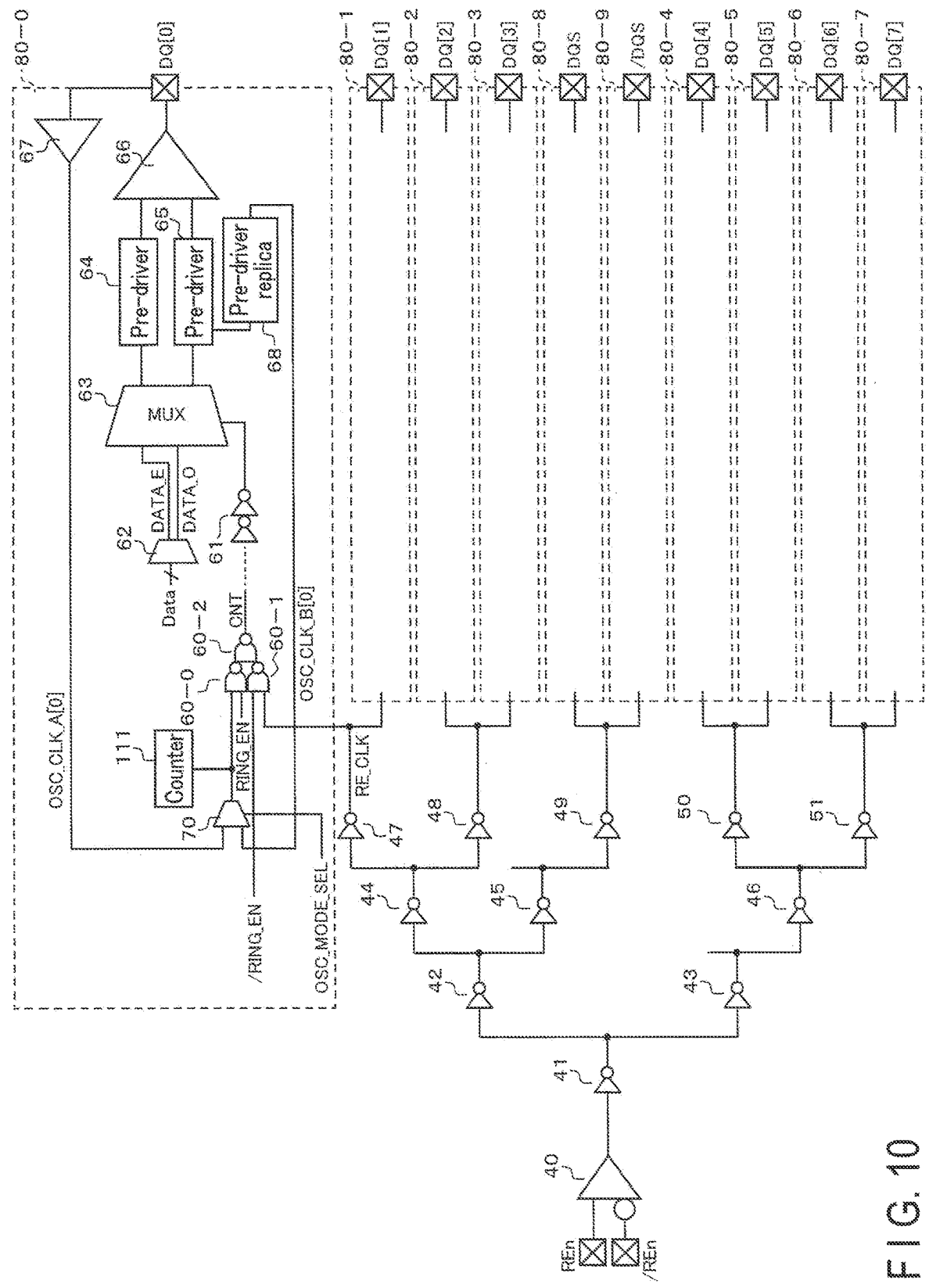
F I G. 10

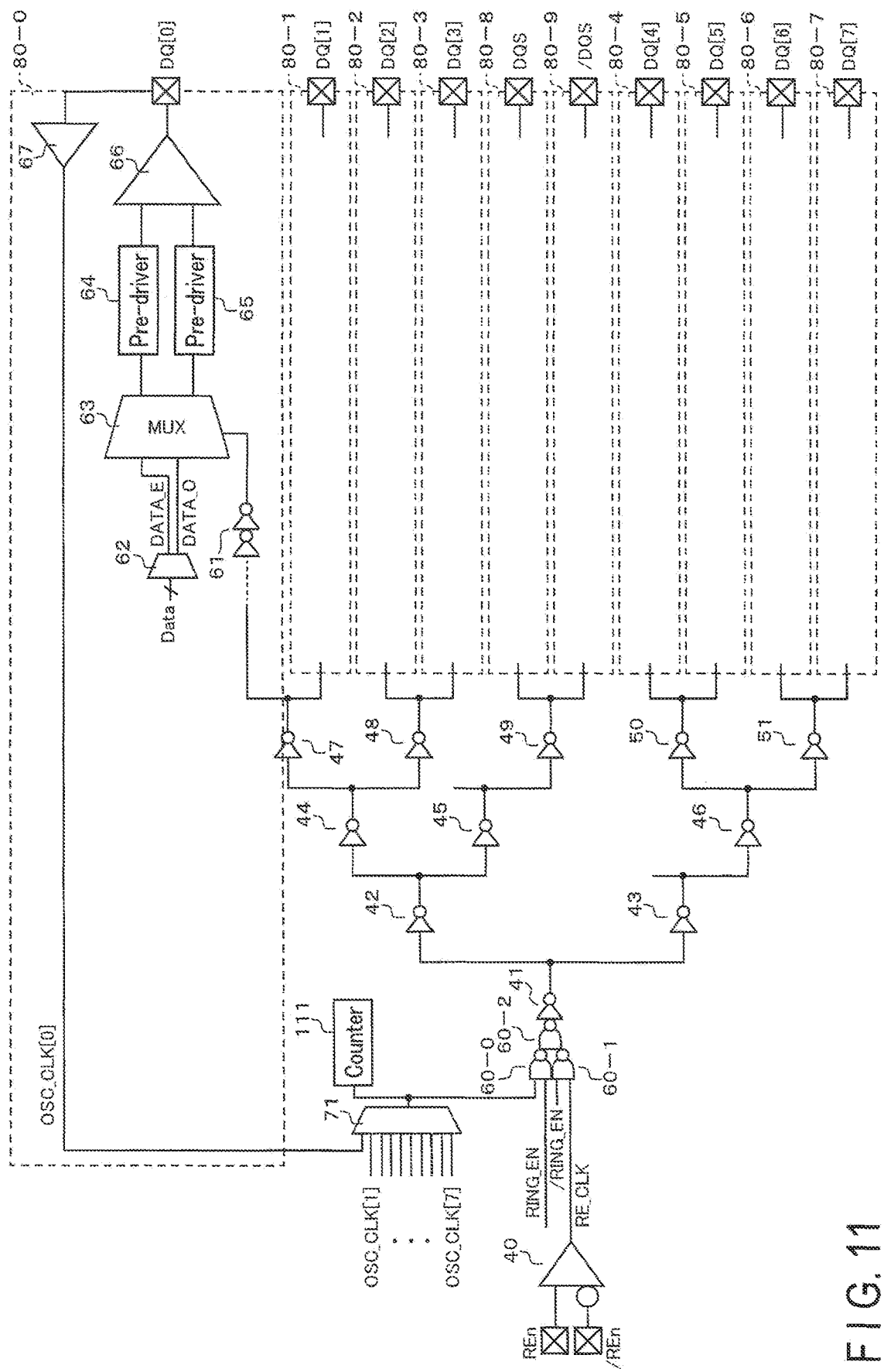
F I G. 11

SEMICONDUCTOR MEMORY DEVICE WITH A VARIABLE DELAY FOR A DATA SELECT SIGNAL AND A COUNTER FOR COUNTING A SELECTED DATA SIGNAL DURING A TEST OPERATION

CROSS-REFERENCE TO RELATED APPLICATIONS

This application is a Continuation application of PCT Application No. PCT/JP2019/040039, filed Oct. 10, 2019, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 4A is a circuit diagram showing part of an input/output circuit included in the semiconductor memory device according to the first embodiment.

FIG. 8 is a circuit diagram showing a first example of part of an input/output circuit included in a semiconductor memory device according to a second embodiment.

FIG. 10 is a circuit diagram showing part of an input/output circuit included in a semiconductor memory device according to a third embodiment.

FIG. 11 is a circuit diagram showing part of an input/output circuit included in a semiconductor memory device according to a fourth embodiment.

DETAILED DESCRIPTION

Figure 1:
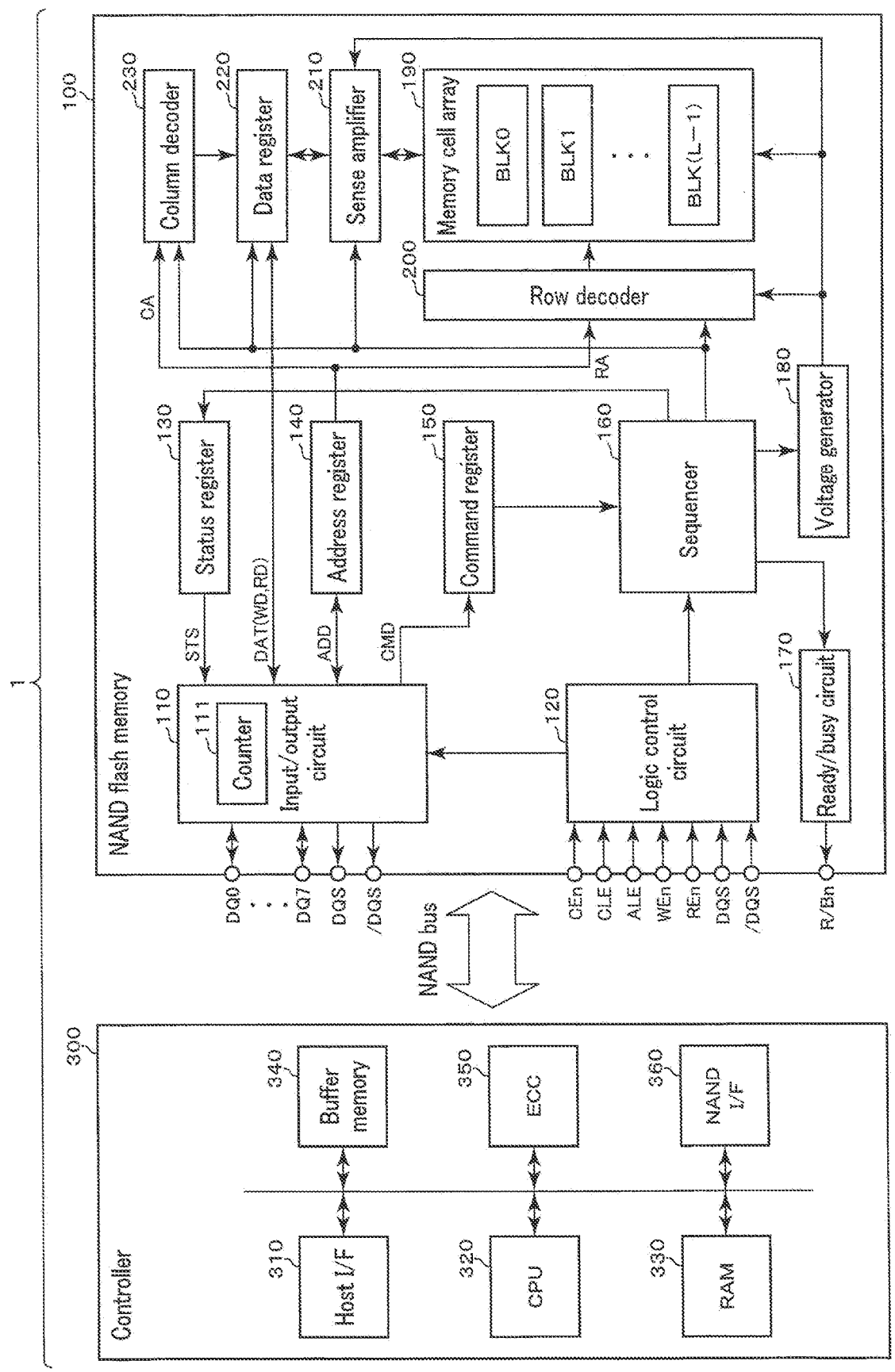
FIG. 1 is a block diagram of a memory system according to a first embodiment.

In general, according to one embodiment, a semiconductor memory device includes: a first delay circuit configured to delay a first signal and provide a variable delay time; a first select circuit configured to select a second signal or a third signal based on the first signal delayed by the first delay circuit; a first output buffer configured to output a fourth signal based on a signal selected by the first select circuit; a first output pad configured to externally output the fourth signal; and a counter configured to count a number of times the fourth signal is output.

Hereinafter, embodiments will be described with reference to the drawings. In the description, common parts are assigned common reference numerals throughout the drawings.

1. First Embodiment

A semiconductor memory device according to a first embodiment will be described. As an example of the semiconductor memory device, a three-dimensionally stacked NAND flash memory, in which memory cell transistors are three-dimensionally stacked above a semiconductor substrate, will be described below.

1.1 Configuration 1.1.1 Overall Configuration of Memory System

First, a rough overall configuration of a memory system including the semiconductor memory device according to the present embodiment will be described with reference to FIG. 1. FIG. 1 is a block diagram of the memory system according to the present embodiment.

As shown in FIG. 1, a memory system 1 includes a NAND flash memory 100 and a controller 300. The NAND flash memory 100 and the controller 300 in combination, for example, may constitute a single semiconductor memory device; examples of such a semiconductor memory device include a memory card such as an SD™ card, a solid state drive (SSD), etc.

The NAND flash memory 100 includes a plurality of memory cells and stores data in a non-volatile manner. The controller 300 is coupled to the NAND flash memory 100 by a NAND bus and is coupled to a host device (not shown) by a host bus (not shown). The controller 300 controls the NAND flash memory 100, and accesses the NAND flash memory 100 in response to an instruction received from the host device. The host device is, for example, a digital camera, a personal computer, etc. The host bus is, for example, an SD™ interface-compatible bus.

The NAND bus transmits and receives signals compatible with a NAND interface. Specific examples of these signals include a chip enable signal CEn, a command latch enable signal CLE, an address latch enable signal ALE, a write enable signal WEn, read enable signals REn and /REn (an inversion signal of the signal REn), a ready/busy signal R/Bn, an input/output signal DQ, and clock signals DQS and /DQS (an inversion signal of the signal DQS).

The chip enable signal CEn is a signal for enabling the NAND flash memory 100, and is asserted at, for example, a low ("L") level. The term "assert" means that a signal (or logic) is in a valid (active) state. The opposite term "negate" means that a signal (or logic) is in an invalid (inactive) state. The command latch enable signal CLE is a signal indicating that the signal DQ is a command, and is asserted at, for example, a high ("H") level. The address latch enable signal ALE is a signal indicating that the signal DQ is an address, and is asserted at, for example, the "H" level. The write enable signal WEn is a signal for fetching a received signal into the NAND flash memory 100, and is asserted at, for example, the "L" level every time a command and an address is received from the controller 300. Accordingly, every time the write enable signal WEn is toggled, signal DQ is fetched into the NAND flash memory 100. The read enable signal REn is a signal for the controller 300 to read data from the NAND flash memory 100. The read enable signal REn is asserted, for example, at the "L" level. Accordingly, the NAND flash memory 100 outputs the signal DQ to the controller 300 based on the toggled read enable signal REn.

The ready/busy signal R/Bn is a signal indicating whether the NAND flash memory 100 is in a busy state or in a ready state (whether or not a command can be received from the controller 300). For example, the ready/busy signal R/Bn is set to the "L" level when the NAND flash memory 100 is in the busy state.

Examples of the input/output signal DQ include eight-bit signals DQ0 to DQ7 (hereinafter, these eight signals DQ will be respectively referred to as signals DQ[0] to DQ[7] when they are distinguished from each other, and will be simply referred to as a signal DQ or a signal DQ[7:0] when they are not distinguished from each other). The input/output signal DQ is an entity of data transmitted and received between the NAND flash memory 100 and the controller 300. Examples of input/output signal DQ include a command, an address, write data, and read data. The clock signals DQS and /DQS control timing of transmitting and receiving of, for example, the signal DQ[7:0]. For example, when data is written, the signals DQS and /DQS along with the write data DQ are transmitted from the controller 300 to the NAND flash memory 100. The signals DQS and /DQS are then toggled, and the NAND flash memory 100 receives the write data DQ, in synchronization with the signals DQS and /DQS. When data is read, the signals DQS and /DQS along with the read data DQ are transmitted from the NAND flash memory 100 to the controller 300. The signals DQS and /DQS are generated based on the aforementioned read enable signal REn. The signals DQS and /DQS are then toggled, and the controller 300 receives the read data DQ, in synchronization with the signals DQS and /DQS.

1.1.2 Configuration of Controller 300

Details of a configuration of the controller 300 will be described in detail by continuously referring to FIG. 1. As shown in FIG. 1, the controller 300 includes a host interface circuit 310, a processor (CPU) 320, a built-in memory (RAM) 330, a buffer memory 340, an ECC circuit 350, and a NAND interface circuit 360.

The host interface circuit 310 is coupled to the host device (not shown) via the host bus (not shown) to transfer an instruction and data received from the host device respectively to the processor 320 and the buffer memory 340. The host interface circuit 310 also transfers data in the buffer memory 340 to the host device in response to an instruction received from the processor 320.

The processor 320 controls the operation of the entire controller 300. For example, upon receipt of a write instruction from the host device, the processor 320 issues, in response thereto, a write instruction to the NAND interface circuit 360. Similar processing is performed when reading and erasing data. The processor 320 also executes various types of processing, such as wear leveling, for managing the NAND flash memory 100.

The NAND interface circuit 360 is coupled to the NAND flash memory 100 via the NAND bus to communicate with the NAND flash memory 100. Then, the NAND interface circuit 360 outputs the signals CEn, CLE, ALE, WEn, REn, DOS, and /DQS based on an instruction received from the processor 320 to the NAND flash memory 100. At the time of writing, the NAND interface circuit 360 transfers, as the signals DQ, the write command issued by the processor 320 and the write data in the buffer memory 340 to the NAND flash memory 100. At the time of reading, the NAND interface circuit 360 transfers, as the signal DQ, the read command issued by the processor 320 to the NAND flash memory 100, receives, as the signal DQ, data read from the NAND flash memory 100, and transfers the received data to the buffer memory 340.

The buffer memory 340 temporarily stores write data and read data.

The built-in memory 330 is, for example, a semiconductor memory such as a DRAM, and is used as a work area of the processor 320. The built-in memory 330 stores firmware for managing the NAND flash memory 100, various management tables, etc.

The ECC circuit 350 executes error checking and correcting (ECC) processing on data. The ECC circuit 350 generates parity based on write data when writing data, and generates a syndrome from the parity to detect an error, and corrects the error when reading data. The processor 320 may have the function of the ECC circuit 350.

1.1.3 Configuration of NAND Flash Memory 100

The configuration of the NAND flash memory 100 will be described in detail by continuously referring to FIG. 1. In FIG. 1, some of the couplings between blocks are indicated by arrows; however, the couplings between blocks are not limited to those shown in FIG. 1.

As shown in FIG. 1, the NAND flash memory 100 includes an input/output circuit 110, a logic control circuit 120, a status register 130, an address register 140, a command register 150, a sequencer 160, a ready/busy circuit 170, a voltage generator 180, a memory cell array 190, a row decoder 200, a sense amplifier 210, a data register 220, and a column decoder 230.

The input/output circuit 110 controls input and output of the signal DQ from and to the controller 300, and output of the signals DQS and /DQS thereto. Specifically, the input/output circuit 110 includes an input circuit and an output circuit (both not shown). The input circuit transmits data DAT (write data WD) received from the controller 300 to the data register 220, transmits an address ADD to the address register 140, and transmits a command CMD to the command register 150. The output circuit transmits, to the controller 300, status information STS received from the status register 130, data DAT (read data RD) received from the data register 220, and the address ADD received from the address register 140. The input/output circuit 110 further includes a counter 111. The counter 111 is used during a test operation of the NAND flash memory 100, and counts the number of times data is output during a certain period of time, for example. The operation of this counter 111 will be described in detail later. The input/output circuit 110 and the data register 220 are coupled to each other via a data bus.

The logic control circuit 120 receives, for example, the signals CEn, CLE, ALE, WEn, REn, DQS, and /DQS from the controller 300. The logic control circuit 120 controls the input/output circuit 110 and the sequencer 160 in accordance with the received signal.

The status register 130 temporarily stores the status information STS. The status information STS is, for example, information indicative of whether or not a write operation, a read operation, and an erase operation have been properly completed. By reading the status information STS, the controller 300 can determine whether these operations have been properly completed.

The address register 140 temporarily stores an address ADD received from the controller 300 via the input/output circuit 110. Then, the address register 140 transfers a row address RA to the row decoder 200, and a column address CA to the column decoder 230.

The command register 150 temporarily stores the command CMD received from the controller 300 via the input/output circuit 110, and transfers the command CMD to the sequencer 160.

The sequencer 160 controls operations of the entire NAND flash memory 100. Specifically, in accordance with the command CMD stored in the command register 150, the sequencer 160 controls, for example, the status register 130, the ready/busy circuit 170, the voltage generator 180, the row decoder 200, the sense amplifier 210, the data register 220, the column decoder 230, etc., to execute a write operation, a read operation, an erase operation, etc. The sequencer 160 incorporates, for example, a timer circuit (not shown). The timer circuit measures time during a test operation to be described later. The timer circuit may be provided outside of the sequencer 160.

The ready/busy circuit 170 transmits the ready/busy signal R/Bn to the controller 300 in accordance with an operation status of the sequencer 160.

In accordance with the control by the sequencer 160, the voltage generator 180 generates a voltage necessary for a write operation, a read operation, and an erase operation, and supplies the generated voltages to, for example, the memory cell array 190, the row decoder 200, the sense amplifier 210, etc. The row decoder 200 and the sense amplifier 210 apply the voltages supplied from the voltage generator 180 to memory cell transistors in the memory cell array 190.

The memory cell array 190 includes a plurality of blocks BLK (BLK0, BLK1, . . . , BLK(L−1) where (L−1) is a natural number equal to or greater than 2) each including nonvolatile memory cell transistors (also referred to as "memory cells" hereinafter) associated with rows and columns. Each block BLK includes a plurality of string units SU (SU0, SU1, SU2, SU3, . . . ). Each string unit SU includes a plurality of NAND strings. The number of blocks BLK in the memory cell array 190 and the number of string units SU in each of the blocks BLK are freely selected. The memory cell array 190 will be described in detail later.

The row decoder 200 decodes the row address RA. The row decoder 200 selects one of the blocks BLK and further selects one of the string units SU based on a result of decoding. The row decoder 200 applies a necessary voltage to the block BLK.

In a read operation, the sense amplifier 210 senses data read from the memory cell array 190. The sense amplifier 210 transmits read data RD to the data register 220. In a write operation, the sense amplifier 210 transmits write data WD to the memory cell array 190.

The data register 220 includes a plurality of latch circuits. The latch circuits store the write data WD and the read data RD. For example, in a write operation, the data register 220 temporarily stores the write data WD received from the input/output circuit 110, and transmits the write data WD to the sense amplifier 210. For example, in a read operation, the data register 220 temporarily stores the read data RD received from the sense amplifier 210, and transmits the read data RD to the input/output circuit 110.

For example, in a write operation, a read operation, and an erase operation, the column decoder 230 decodes a column address CA, and selects a latch circuit in the data register 220 in accordance with a result of decoding.

1.1.4 Circuit Configuration of Memory Cell Array 190

Figure 2:
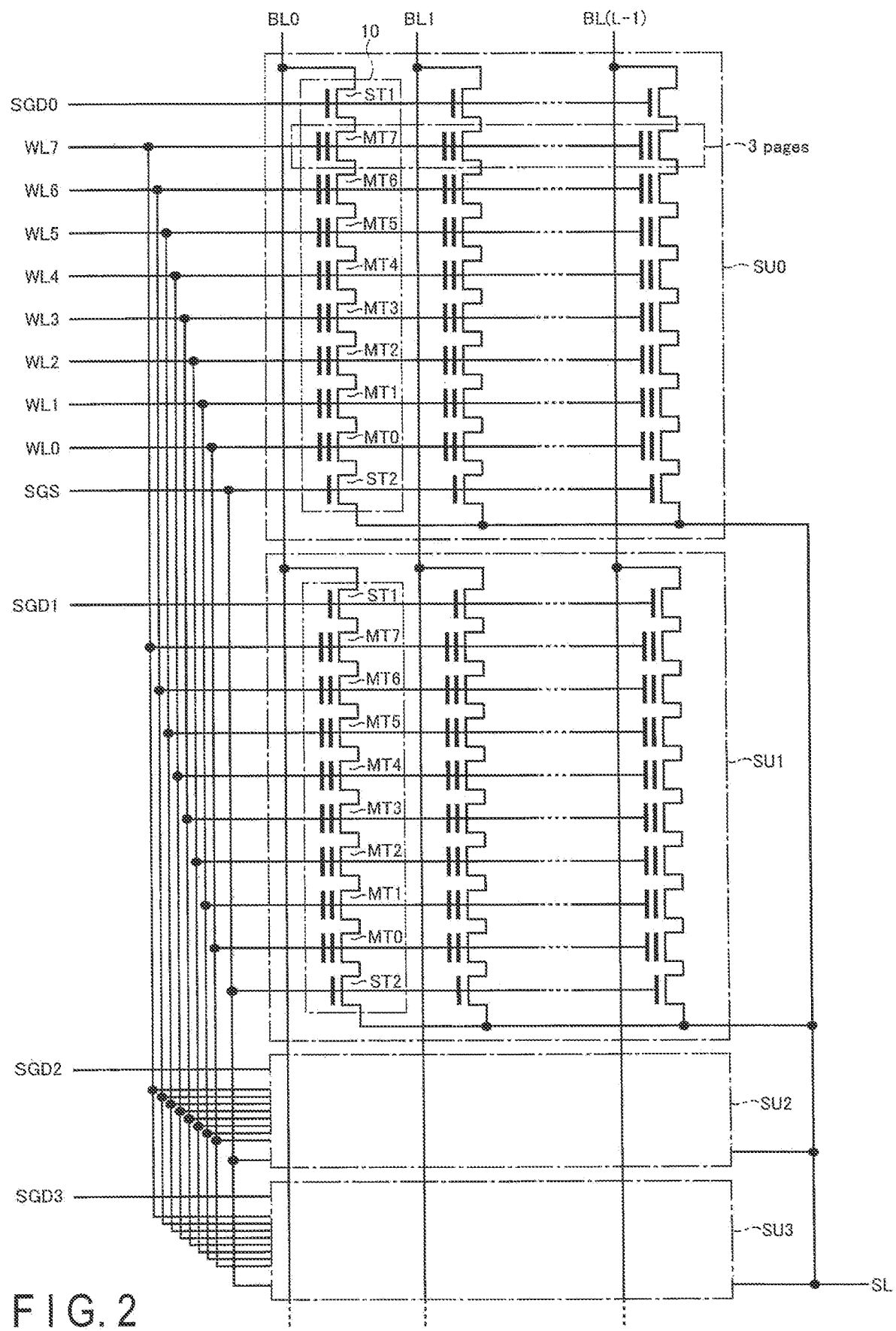
FIG. 2 is a circuit diagram of a memory cell array included in a semiconductor memory device according to the first embodiment.

Next, a circuit configuration of the memory cell array 190 will be described. As described above, the memory cell array 190 includes the plurality of blocks BLK (BLK0, BLK1, . . . , BLK(L−1)). FIG. 2 is a circuit diagram of one block BLK, and the other blocks BLK have similar configurations.

As shown in FIG. 2, a block BLK includes, for example, four string units SU (SU0 to SU3). Each of the string units SU includes a plurality of NAND strings 10.

Each of the NAND strings 10 includes, for example, eight memory cell transistors MT (MT0 to MT7) and select transistors ST1 and ST2. The memory cell transistors MT each include a control gate and a charge storage layer, and store data in a nonvolatile manner. The memory cell transistors MT are coupled in series between a source of the select transistor ST1 and a drain of the select transistor ST2.

The string units SU0 to SU3 include select transistors ST1 whose gates are coupled to select gate lines SGD0 to SGD3, respectively. On the other hand, the string units SU0 to SU3 include select transistors ST2 whose gates are coupled in common to, for example, a select gate line SGS. Needless to say, the gates of the select transistors ST2 may be coupled to respective different select gate lines SGS0 to SGS3. The memory cell transistors MT0 to MT7 included in the same block BLK have their control gates coupled to word lines WL0 to WL7, respectively.

Drains of select transistors ST1 of the NAND strings 10 in the same column within the memory cell array 190 are coupled in common to bit line BL (BL0, BL1, . . . , BL(L−1) where (L−1) is a natural number equal to or larger than 2). Namely, a bit line BL couples the NAND strings 10 together in common among a plurality of blocks BLK. Furthermore, the plurality of select transistors ST2 have their sources coupled in common to a source line SL.

Namely, the string unit SU includes a plurality of NAND strings 10 coupled to different bit lines BL and coupled to the same selection gate line SGD. Each block BLK includes a plurality of string units SU that share a word line WL. The memory cell array 190 includes a plurality of blocks BLK that share a bit line BL.

In this example, one memory cell transistor MT can store, for example, 3-bit data. Bits constituting this 3-bit data will be referred to as a lower bit, a middle bit, and an upper bit in ascending order from the least significant bit. In one string unit SU, multiple memory cells coupled to the same word line WL store together a set of lower bits, which will be called a lower page, a set of middle bits, which will be called a middle page, and a set of upper bits, which will be called an upper page. In other words, a single word line WL is assigned three pages. Therefore, a "page" may also be defined as a portion of a memory space formed by memory cells coupled to the same word line. Data write and data read is performed for each page. In this example, a single string unit SU has eight word lines, which means that each string unit SU has (3 pages×8)=24 pages, and a single block BLK has four string units SU, which means each block BLK has (24 pages×4)=96 pages.

Figure 3:
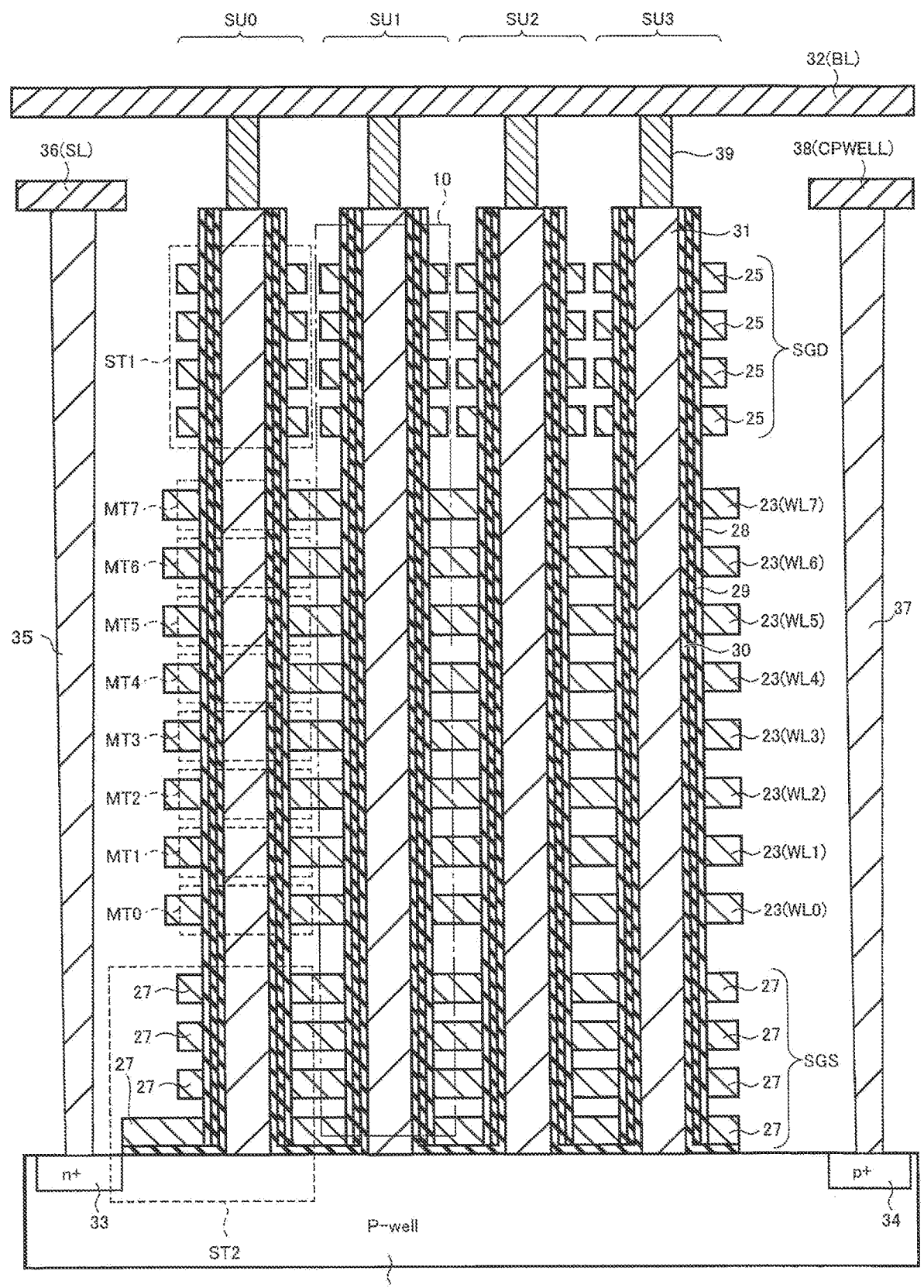
FIG. 3 is a sectional view of the memory cell array included in the semiconductor memory device according to the first embodiment.

FIG. 3 is a cross-sectional view of a partial region of a block BLK. As shown in FIG. 3, a plurality of NAND strings 10 are formed on a p-type well region 20. Namely, for example, four interconnect layers 27 respectively functioning as select gate lines SGS, eight interconnect layers 23 respectively functioning as word lines WL0 to WL7, and four interconnect layers 25 functioning as select gate lines SGD are sequentially stacked above the well region 20. Insulating films (not shown) are formed between the stacked interconnect layers.

A pillar-shaped conductor 31 that penetrates interconnect layers 25, 23, and 27 and reaches the well region 20 is formed. A gate insulating film 30, a charge storage layer (insulating film) 29, and a block insulating film 28 are sequentially formed on the side surface of the conductor 31, thereby forming memory cell transistors MT and select transistors ST1 and ST2. Each conductor 31 functions as a current path for each NAND string 10, and is used as a region in which a channel of each transistor is formed. The upper end of the conductor 31 is coupled via a contact plug 39 to a metal interconnect layer 32 that functions as bit line BL.

In a surface region of the well region 20, an $n^+$-type impurity diffusion layer 33 is formed. A contact plug 35 is formed above the diffusion layer 33, and is coupled to a metal interconnect layer 36 that functions as source line SL. In the surface region of the well region 20, a $p^+$-type impurity diffusion layer 34 is also formed. A contact plug 37 is formed on the diffusion layer 34, and is coupled to a metal interconnect layer 38 that functions as a well interconnect CPWELL. The well interconnect CPWELL is used to apply a potential to the conductor 31 via the well region 20.

A plurality of structures described above are arranged in the depth direction of the sheet of FIG. 3, and a set of NAND strings 10 arranged in the depth direction forms one string unit SU.

1.1.5 Configuration of Input/Output Circuit 110

Next, a circuit configuration of the input/output circuit 110 will be described with reference to FIG. 4A. FIG. 4A is a circuit diagram showing part of the input/output circuit according to the present embodiment, and focuses in particular on a circuit block for receiving the read enable signal REn and transmitting and receiving the signal DO.

As shown in FIG. 4A, the input/output circuit 110 includes an input buffer 40, inverters 41 to 51, and input/output blocks 80-0 to 80-9.

The input buffer 40 receives the signals REn and /REn from the controller 300, and outputs signals in accordance with these signals. An output signal of the input buffer 40 is transferred to the input/output blocks 80-0 to 80-9 via the inverters 41 to 51. More specifically, an output signal of the input buffer 40 is inverted by the inverter 41, an output signal of the inverter 41 is inverted by each of the inverters 42 and 43, an output signal of the inverter 42 is inverted by each of the inverters 44 and 45, and an output signal of the inverter 43 is inverted by the inverter 46. Then, an output signal of the inverter 44 is inverted by each of the inverters 47 and 48, an output signal of the inverter 45 is inverted by the inverter 49, and an output signal of the inverter 46 is inverted by each of the inverters 50 and 51. An output signal of the inverter 47 is input to each of the input/output blocks 80-0 and 80-1, an output signal of the inverter 48 is input to each of the input/output blocks 80-2 and 80-3, and an output signal of the inverter 49 is input to each of the input/output blocks 80-8 and 80-9. An output signal of the inverter 50 is input to each of the input/output blocks 80-4 and 80-5, and an output signal of the inverter 51 is input to each of the input/output blocks 80-6 and 80-7.

The input/output block 80-0 includes NAND gates 60-0 to 60-2, a delay circuit 61, a select circuit 62, a multiplexer (MUX) 63, pre-drivers 64 and 65, an output buffer 66, an input buffer 67, and a counter 111.

The NAND gate 60-0 performs a NAND operation of a signal OSC_CLK[0] (a signal OSC_CLK in the input/output block 80-0) and a signal RING_EN. Hereinafter, eight signals OSC_CLK in the input/output blocks 80-0 to 80-7 will be respectively referred to as signals OSC_CLK[0] to OSC_CLK[7] when they are distinguished from each other, and will be simply referred to as a signal OSC_CLK when they are not distinguished from each other. The NAND gate 60-1 performs a NAND operation of a signal RE_CLK and a signal /RING_EN (an inversion signal of the signal RING_EN). The NAND gate 60-2 performs a NAND operation of an output signal of each of the NAND gates 60-0 and 60-1. The signal RING_EN is, for example, a signal given by the sequencer 160, and is asserted during a test operation to be described later. The signal RE_CLK is an output signal of each of the inverters 47 to 51. The signal OSC_CLK[0] is an output signal of the input buffer 67 in the input/output block 80-0.

The delay circuit 61 receives an output signal of the NAND gate 60-2 (hereinafter referred to as a "signal CNT") as an input signal, adjusts the speed of this signal, and outputs it. The delay circuit 61 includes, for example, a plurality of inverters coupled in series.

Figure 4B:
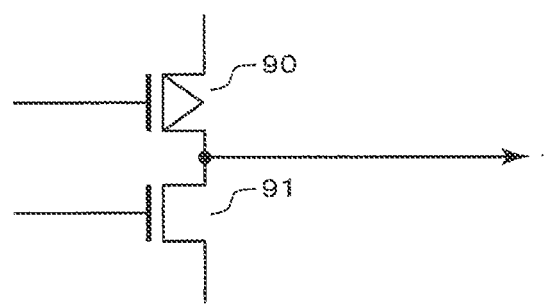
FIG. 4B is a circuit diagram of an output buffer included in the input/output circuit in FIG. 4A.

The select circuit 62 receives multiple-bit data Data (for example, eight-bit data read from the memory cell array 190 or multiple-bit data given by a tester, etc.), selects one of the multiple bits, and outputs data corresponding to the selected bit (hereinafter referred to as "signal DATA_E") and its inversion data (hereinafter referred to as "signal DATA_O"). The MUX 63 selects one of the two output signals DATA_E and DATA_O of the select circuit 62 in accordance with an output signal of the delay circuit 61. The pre-drivers 64 and 65 receive each of the two output signals of the MUX 63, shape each of their waveforms, and output them. The output buffer 66 receives each of the output signals of the pre-drivers 64 and 65, and outputs a signal in accordance with these received signals. The output buffer 66 has such a configuration as illustrated in FIG. 4B, for example. FIG. 4B is a circuit diagram of the output buffer 66. As shown in FIG. 4B, the output buffer 66 includes a p-channel MOS transistor 90 and an n-channel MOS transistor 91. An output of the pre-driver 64 is coupled to a gate of the transistor 90, and an output of the pre-driver 65 is coupled to a gate of the transistor 91. A drain of the transistor 90 is coupled to a drain of the transistor 91, a source of the transistor 90 is coupled to a power supply voltage, and a source of the transistor 91 is grounded. An output signal of the output buffer 66 is output as a signal DQ[0] to an input/output pad.

The input buffer 67 receives a signal DQ[0] input from outside via the input/output pad, temporarily stores it, and outputs it to the NAND gate 60-0. The input buffer 67 is coupled to the counter 111. The counter 111 counts the number of times the signal OSC_CLK[0], that is, the signal DQ[0], is toggled. That is, the counter 111 counts up (or may count down) at a timing when the signal OSC_CLK[0] switches from a logical "H" level to a logical "L" level and a timing when it switches from the logical "L" level to the logical "H" level. The counter 111 then transfers a counter value to the sequencer 160.

FIG. 4A omits an illustration of the input/output blocks 80-1 to 80-7 since they are similar in configuration to the input/output block 80-0. That is, as with the input/output block 80-0, the input/output blocks 80-1 to 80-7 each include the NAND gates 60-0 to 60-2, the delay circuit 61, the select circuit 62, the MUX 63, the pre-drivers 64 and 65, the output buffer 66, the input buffer 67, and the counter 111. Signals input to or output from the input/output blocks 80-1 to 80-7 are signals DQ[1], DQ[2], . . . , DQ[7].

The input/output block 80-8, although a detailed illustration of its circuit is omitted, generates the signal DQS based on the read enable signal REn. The signal DQS is a signal synchronized with the signal REn. For example, at the time of reading, the signal DQS functions as a clock for transmission of read data, and read data DQ[7:0] is transmitted to the controller 300 while being synchronized with the signal DOS. This applies to the input/output block 80-9, and the input/output block 80-9 generates a signal /DQS which is an inversion signal of the signal DQS.

FIG. 4A illustrates an example in which the counter 111 is provided inside the input/output circuit 110. However, the counter 111 may be provided outside the input/output circuit 110. For example, the counter 111 may be provided inside the sequencer 160, inside the controller 300, or inside a tester used during a test operation.

1.2 Operation of Input/Output Circuit 110

Figure 5:
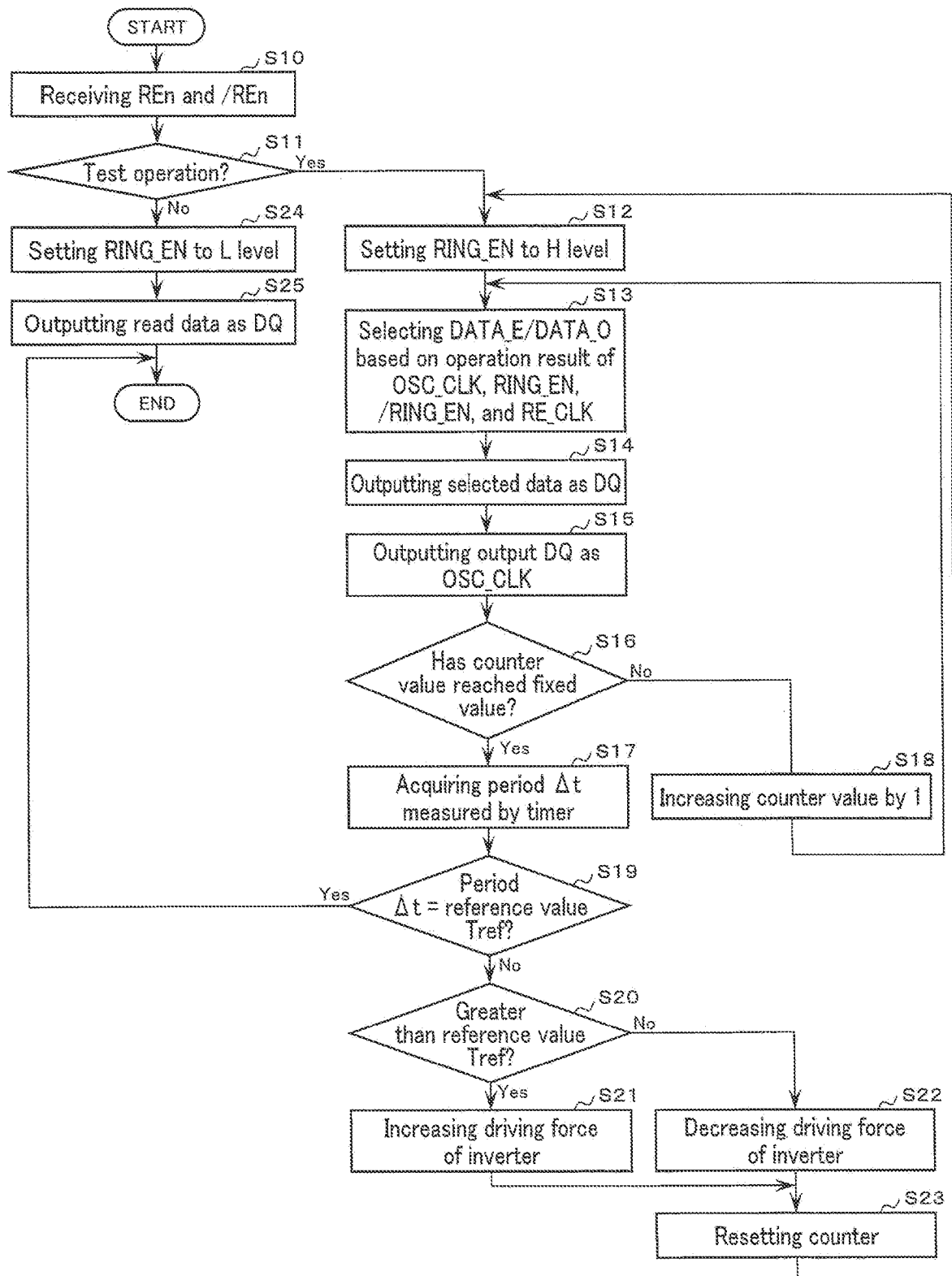
FIG. 5 is a flowchart showing an operation of the input/output circuit during a test operation and a read operation of the semiconductor memory device according to the first embodiment.

First, an operation of the input/output circuit 110 will be described with reference to FIG. 5. FIG. 5 is a flowchart showing an operation of the input/output circuit 110 during a test operation and a read operation. The test operation according to the present embodiment adjusts the timing of outputting data from the MUX 63 with respect to each of the input/output blocks 80-0 to 80-7 such as are shown in FIG. 4A. Hereinafter, description will be given focusing on, in particular, the input/output block 80-0 during a test operation and a read operation.

As shown in FIG. 5, the input/output circuit 110 receives the signals REn and /REn (step S10). In accordance with the signals REn and /REn, the signal RE_CLK is generated by the input buffer 40 and the inverters 41, 42, 44, and 47.

Next, the sequencer 160, for example, of the NAND flash memory 100 determines whether or not a current operation is a test operation (step S11). Examples of a case in which the current operation is not the test operation include a normal data read operation and a status information read operation.

In the case of the current operation being the test operation (step S11, Yes), for example, the sequencer 160 sets the signal RING_EN to the "H" level (step S12). A logical level of the output signal OSC_CLK[0] of the input buffer 67 is turned to the "H" level or the "L" level based on the signal DQ[0].

Next, the MUX 63 selects read data (signal DATA_E) or its inversion data (signal DATA_O) based on an operation result of the signals OSC_CLK[0], RING_EN, /RING_EN, and RE_CLK (step S13). Subsequently, the output buffer 66 outputs, as the signal DQ[0], data selected in step S13 to the input/output pad (step S14). Thereafter, the input buffer 67 receives the signal DQ[0] output in step S14 via the input/output pad, and outputs the signal DQ[0] as the signal OSC_CLK[0] (step S15). Then the signal OSC_CLK[0] is input to the NAND gate 60-0 and the counter 111.

Next, the sequencer 160, for example, of the NAND flash memory 100 determines whether or not a counter value of the counter 111 has reached a fixed value determined in advance (step S16).

In the case where the counter value has not reached the fixed value (step S16, No), the counter 111 increases the counter value by, for example, 1 (step S18). At a timing when the counter 111 is counted up for the first time, the aforementioned timer circuit initiates measurement of time. Then, steps S13 to S16 are performed again until the counter value reaches the fixed value. On the other hand, in the case where the counter value has reached the fixed value (step S16, Yes), the timer circuit terminates measurement of time, and the sequencer 160, for example, of the NAND flash memory 100 acquires a period Δt measured by the timer circuit (step S17). More specifically, in the case of the fixed value being, for example, $2^{16}$, the timer circuit initiates measurement of time when the counter value becomes equal to 1 in step S18, and terminates measurement of time when the sequencer 160 determines in step S16 that the counter value has reached $2^{16}$.

The sequencer 160, for example, of the NAND flash memory 100 compares the period Δt acquired in step S17 with a reference value Tref (step S19). The reference value Tref is a value determined in advance as a period required for the counter value to reach the fixed value. For example, the reference value Tref is expressed as 20 ps×$2^{16}$=1.31 μs. However, this value is merely an example, and the reference value Tref may take other values. The reference value Tref is stored along with the fixed value to be counted by the counter 111 into, for example, a ROM fuse within the memory cell array 190. When the NAND flash memory 100 is powered on, the reference value Tref is read out to a register (not shown) with no need for an instruction from the controller 300.

As a result of a comparison, in the case of the period Δt being equal to the reference value Tref (step S19, Yes), the sequencer 160, for example, of the NAND flash memory 100 determines that adjustment of the input/output block 80-0 is unnecessary. On the other hand, in the case of the period Δt being different from the reference value Tref (step S19, No), for example, the sequencer 160 determines whether or not the period Δt acquired in step S17 is greater than the reference value Tref (step S20). The sequencer 160 performs adjustment of the input/output block 80-0 based on a determination result in step S20. Data after adjustment (such as, e.g., delay time) is written into the ROM fuse within the memory cell array 190, for example.

More specifically, in the case of the period Δt being greater than the reference value Tref (step S20, Yes), for example, the sequencer 160 increases a driving force for the inverters of the delay circuit 61 (step S21). This advances the timing of outputting data from the MUX 63.

On the other hand, in the case of the period Δt being smaller than the reference value Tref (step S20, No), for example, the sequencer 160 decreases the driving force for the inverters of the delay circuit 61 (step S22). This delays the timing of outputting data from the MUX 63.

Next, the sequencer 160, for example, of the NAND flash memory 100 resets the counter 111 (step S23). Then steps S12 to S23 are performed again until the adjustment for the input/output block 80-0 becomes unnecessary, that is, until the period at becomes equal to the reference value Tref or a difference between the period Δt and the reference value Tref falls within a fixed allowable range.

The sequencer 160, for example, of the NAND flash memory 100 performs steps S12 to S23 described in the above with respect to the input/output blocks 80-1 to 80-7, too. When the adjustment for all of the input/output blocks 80-0 to 80-7 is completed, the sequencer 160 terminates the test operation.

In the case of the current operation not being the test operation (step S11, No), for example, in the case of it being the normal data read operation, the sequencer 160, for example, of the NAND flash memory 100 sets the signal RING_EN to the "L" level (step S24). At this time, OSC_CLK[0] is disregarded. Next, the output buffer 66 outputs read data (signal DATA_E) as the signal DQ[0] (step S25). More specifically, in synchronization with toggling of the signal REn, the signal DQ[0] is toggled and then output.

The test operation and the read operation are performed with respect to the input/output blocks 80-1 to 80-7, too, by similar ways to those described in the above.

FIG. 5 illustrates an example in which steps S12 to S22 are performed again after the counter 111 is reset in step S23 during the test operation. However, during the test operation, steps S13 to S22 may be performed without performing step S12 after the counter 111 is reset in step S23.

Furthermore, FIG. 5 illustrates an example in which data read from the memory cell array 190 is given to the select circuit 62 during the test operation. However, data may be given from, for example, the tester to the select circuit 62. In such a case, it suffices that a data pattern in which "0" and "1" are repeated is given as the signal DQ.

Figure 6:
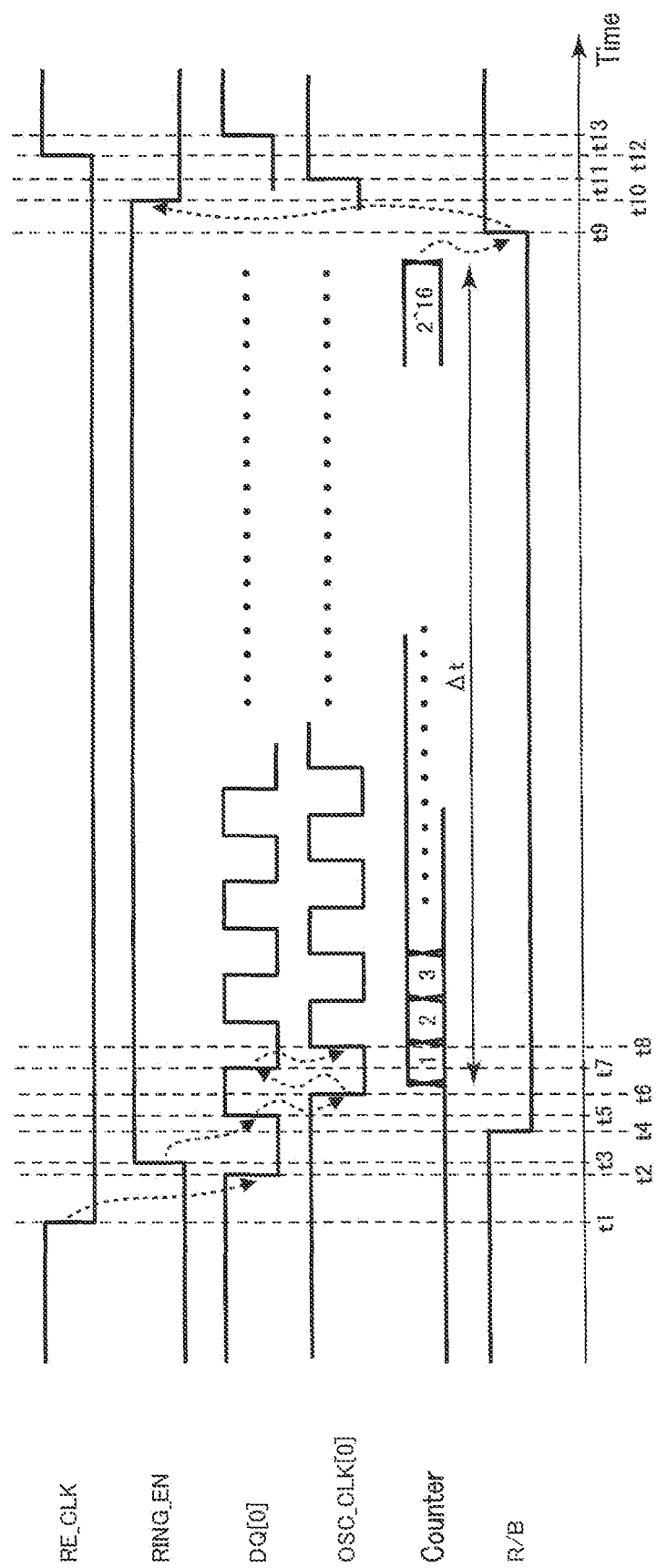
FIG. 6 is a timing chart showing various signals during the test operation of the semiconductor memory device according to the first embodiment.

Next, concrete examples of the test operation will be described with reference to FIG. 6. FIG. 6 is a timing chart showing various signals during the test operation, and in particular, signals related to the signal DQ[0].

At time t1, the signal RE_CLK is turned to the "L" level based on the signals REn and /REn. Accordingly, an output of the NAND gate 60-1 is turned to the "H" level regardless of the signal RING_EN, and as a result, an output of the NAND gate 60-2 depends on an output signal of the NAND gate 60-0. At time t1, the signal RING_EN is at the "L" level whereas the signal OSC_CLK[0] is at the "H" level, so that the output signal CNT of the NAND gate 60-2 is turned to the "L" level.

Based on the signal CNT at the "L" level output from the aforementioned NAND gate 60-2, the MUX 63 selects the signal DATA_E or DATA_O. As a result, assume that the signal DQ[0] transitions from the "H" level to the "L" level at time t2.

Subsequently, at time t3, the sequencer 160 sets the signal RING_EN to the "H" level upon receipt of a test operation instruction. As a result, an output signal of the NAND gate 60-0 depends on the signal OSC_CLK[0], that is, the output signal CNT of the NAND gate 60-2 is determined by the signal OSC_CLK[0].

Thereafter, at time t4, the NAND flash memory 100 is turned to a busy state, and the ready/busy signal is turned to the "L" level. By the signal RING_EN transitioning from the "L" level to the "H" level, the output signal CNT of the NAND gate 60-2 is turned to the "H" level.

Based on the signal CNT at the "H" level output from the aforementioned NAND gate 60-2, the MUX 63 selects the signal DATA_E or DATA_O. As a result, the signal DQ[0] transitions from the "L" level to the "H" level at time t5. At time t6, the signal OSC_CLK[0] transitions from the "H" level to the "L" level via the input buffer 67. The counter 111 then detects a transition of the signal OSC_CLK[0], and initiates counting up. With the initiation of counting up by the counter 111, the aforementioned timer circuit initiate measurement of time.

By the signal OSC_CLK[0] transitioning from the "H" level to the "L" level, the output signal CNT of the NAND gate 60-2 is turned to the "L" level.

Based on the signal CNT at the "L" level output from the aforementioned NAND gate 60-2, the MUX 63 selects the signal DATA_E or DATA_O. As a result, the signal DQ[0] transitions from the "H" level to the "L" level at time t7. At time t8, the signal OSC_CLK[0] transitions from the "L" level to the "H" level via the input buffer 67. The counter 111 then detects a transition of the signal OSC_CLK[0], and performs counting up.

As described in the above, the signal DQ[0] is input to the MUX 63 via the input/output pad, the input buffer 67, the NAND gates 60-0 and 60-2, and the delay circuit 61. As a result, as shown in FIG. 6, the signals DQ[0] and OSC_CLK[0] exhibit a toggle behavior as shown in FIG. 6. Based on this toggle behavior, the counter 111 performs counting up. The counter 111 performs counting up (or counting down, as a matter of course) until the counter value reaches a predetermined value ($2^{16}$ in the example shown in FIG. 6). When the counter value reaches $2^{16}$, the timer circuit terminates measurement of time. The sequencer 160 compares the measured period Δt with the reference value Tref. In the case of the measured period Δt being different from the reference value Tref, the sequencer 160 adjusts the delay time of the delay circuit 61, and repeats the same operation.

1.3 Advantageous Effect of Present Embodiment

Figure 7:
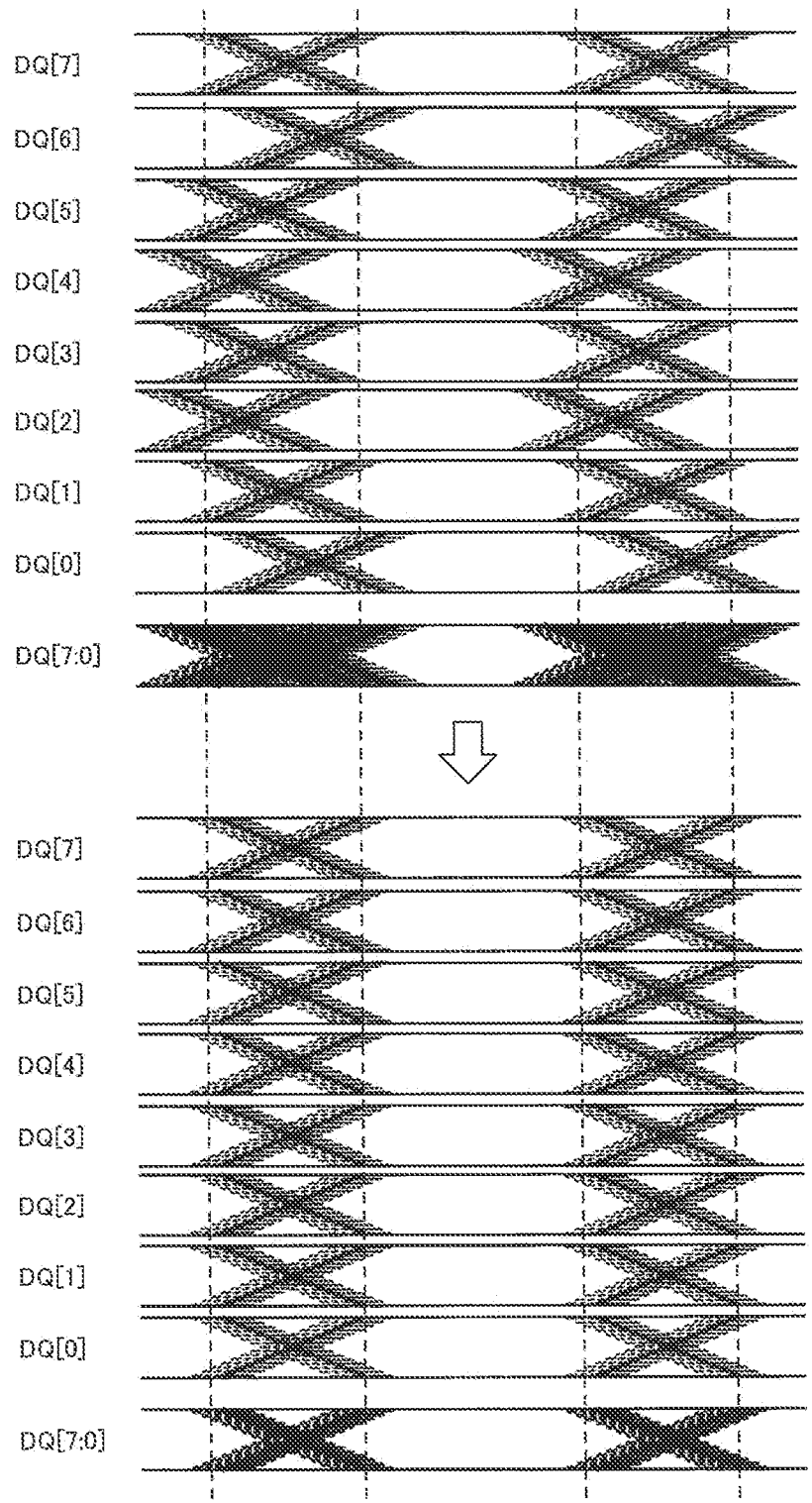
FIG. 7 is a schematic diagram illustrating a deviation in timing of outputting a signal from the input/output circuit.
Figure 9:
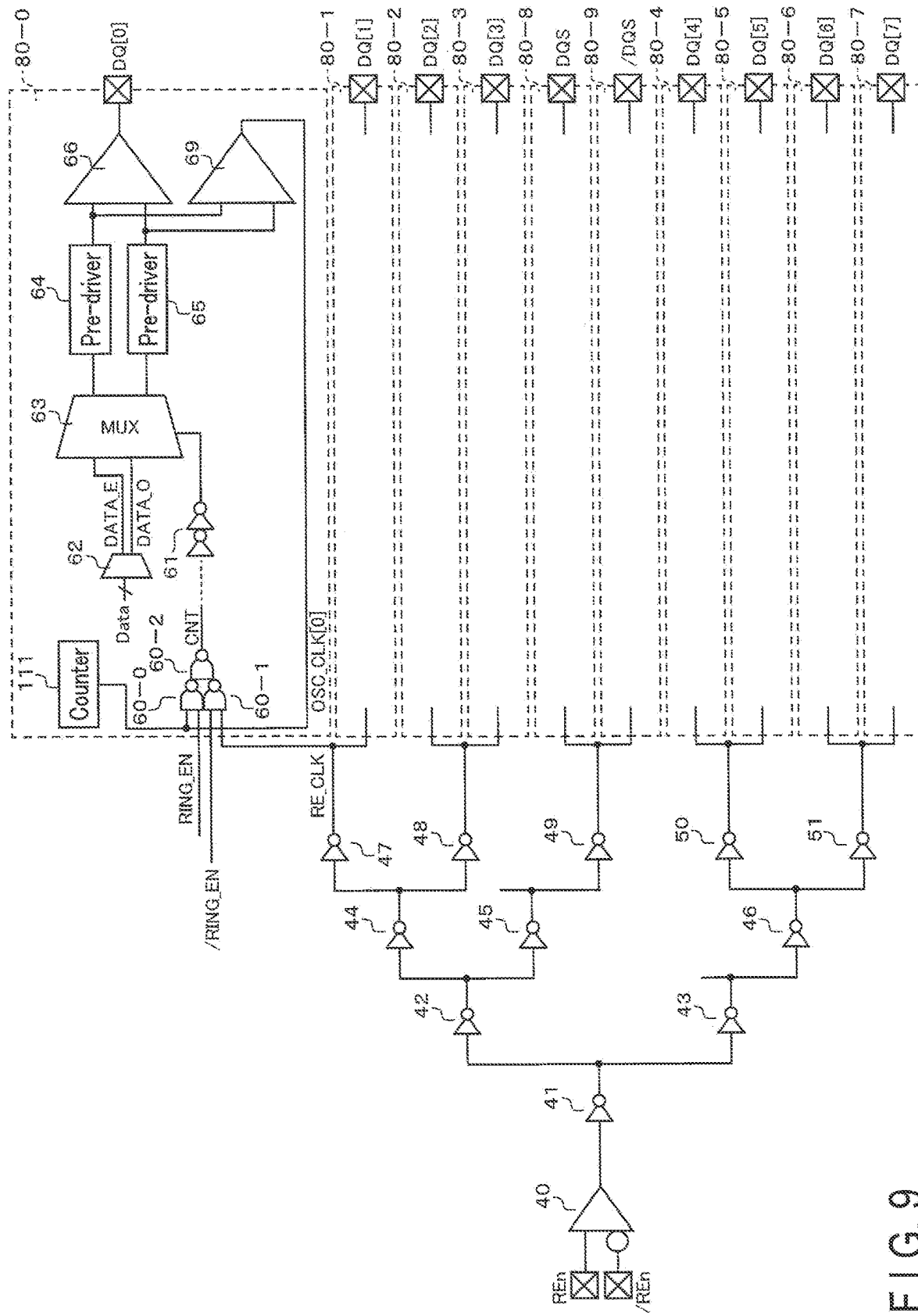
FIG. 9 is a circuit diagram showing a second example of part of the input/output circuit included in the semiconductor memory device according to the second embodiment.

The configuration according to the present embodiment can improve the operational reliability of the semiconductor memory device. The advantageous effect will be described below. FIG. 7 shows waveform charts of the signals DQ[0] to DQ[7] and a waveform chart showing an effective margin of the resultant entire signal DQ[7:0].

The output timing of the signal DQ[7:0] may vary depending on variations in the properties between the elements in the input/output blocks 80-0 to 80-7. This is illustrated in the upper part of FIG. 7. As shown in FIG. 7, for example, the signal DQ[7] transitions at a timing within an allowable range. However, a transition of the signal DQ[6] is greatly delayed in time whereas a transition of the signal DQ[2] is too early in time. As a result, there is a possibility that the effective margin of the entire signal DQ[7:0] will be extremely narrow.

Accordingly, in the present embodiment, in each of the input/output blocks of the input/output circuit 110, the signal DQ output from the MUX 63 is fed back to the delay circuit 61, thereby adjusting the delay time of the delay circuit 61 during the test operation. More specifically, the number of times the signal DQ is output is counted, and the period Δt until the number of times counting is performed reaches a fixed number, that is, until the counter value of the counter 11 reaches the fixed value, is compared with the reference value Tref. The delay time of the delay circuit 61 is adjusted until the period Δt becomes equal to the reference value Tref or a difference between the period Δt and the reference value Tref falls within a fixed allowable range. As a result, variations in the properties between the plurality of input/output blocks can be corrected. In this manner, as shown in the lower part of FIG. 7, the signals DQ[0] to DQ[7] can be made approximately the same in terms of transition timing, so that the effective margin as the entire signal DQ[7:0] can be made wider.

Furthermore, the present embodiment includes the counter 111. Thus, it suffices that the tester measures the period Δt until the counter value of the counter 111 reaches the fixed value. Accordingly, a high resolution is not necessary for the tester, and even the tester with a low resolution can accurately adjust a delay time of the delay circuit 61.

2. Second Embodiment

Next, a semiconductor memory device according to a second embodiment will be described. The first embodiment describes a case in which the signal DQ is fed back to the NAND gate 60-0 via the input buffer 67 during the test operation. On the other hand, the present embodiment is configured in such a manner that a replica circuit of the pre-driver 65 or the output buffer 66 is provided, and a signal is fed back via the replica circuit of the pre-driver 65 or the output buffer 66. The following description will in principle concentrate on the features different from the first embodiment.

2.1 First Example of Input/Output Circuit 110

In the first example of the input/output circuit 110 according to the present embodiment, each of the input/output blocks 80-0 to 80-7 described in the first embodiment is provided with a pre-driver replica 68 coupled to the pre-driver 65.

The pre-driver replica 68 has a similar circuit configuration to that of the pre-driver 65, and has similar circuit characteristics thereto. The pre-driver replica 68 receives a signal selected by the MIX 63, shapes its waveform as with the pre-driver 65, and outputs a resultant signal as the signal OSC_CLK to the NAND gate 60-0 and the counter 111. A feedback path from the input buffer 67 to the counter 111 and the NAND gate 60-0 is eliminated from each of the input/output blocks 80-0 to 80-7.

During the test operation, the pre-driver replica 68 outputs, as the signal OSC_CLK, a signal selected by the MUX 63, and the signal OSC_CLK is input to the NAND gate 60-0 and the counter 111.

The operations during the test operation are similar to those described with reference to FIG. 5 and FIG. 6 according to the first embodiment. The difference from the first embodiment is only that the pre-driver replica 68, not the input buffer 67, generates the signal OSC_CLK.

2.2 Second Example of Input/Output Circuit 110

In the second example of the input/output circuit 110 according to the present embodiment, each of the input/output blocks 80-0 to 80-7 described in the first embodiment is provided with an output buffer replica 69 coupled to the pre-drivers 64 and 65.

The output buffer replica 69 has a similar circuit configuration to that of the output buffer 66, and has similar circuit characteristics thereto. The output buffer replica 69 receives a signal selected by the MUX 63, temporarily stores the received signal as with the output buffer 66, and outputs the stored signal as the signal OSC_CLK to the NAND gate 60-0 and the counter 111. A feedback path from the input buffer 67 to the counter 111 and the NAND gate 60-0 is eliminated from each of the input/output blocks 80-0 to 80-7.

In the test operation, the output buffer replica 69 outputs a signal selected by the MUX 63 as the signal OSC_CLK, and the signal OSC_CLK is input to the NAND gate 60-0 and the counter 111.

The operations during the test operation are similar to those described with reference to FIG. 5 and FIG. 6 according to the first embodiment. The difference from the first embodiment is only that the output buffer replica 69, not the input buffer 67, generates the signal OSC_CLK.

2.3 Advantageous Effects of Present Embodiment

The configuration according to the present embodiment enables a data signal (output signal of the MUX 63) to be fed back via the replica circuit of the pre-driver or the output buffer without signal transmission via the input/output pad. As a result, an influence of a load on, for example, a mount substrate, a probe card, etc., can be avoided.

3. Third Embodiment

Next, a semiconductor memory device according to a third embodiment will be described. The present embodiment corresponds to the first embodiment in combination with the first example of the second embodiment. The following description will in principle concentrate on the features different from the first embodiment.

3.1 Configuration of Input/Output Circuit 110

The input/output circuit 110 according to the present embodiment is configured by providing each of the input/output blocks 80-0 to 80-7 described in the first embodiment with the pre-driver replica 68 described in the second embodiment and a select circuit 70.

The select circuit 70 receives the signal OSC_CLK (hereinafter referred to as a "signal OSC_CLK_A") fed back from the input buffer 67 and the signal OSC_CLK (hereinafter referred to as a "signal OSC_CLK_B") fed back from the pre-driver replica 68. The select circuit 70 selects the signal OSC_CLK_A or OSC_CLK_B based on a signal OSC_MODE_SEL, and outputs the selected signal to the NAND gate 60-0 and the counter 111.

During the test operation, the select circuit 70 selects the signal OSC_CLK_A or OSC_CLK_B based on the signal OSC_MODE_SEL received from the sequencer 160, for example, of the NAND flash memory 100, and the selected signal is input to the NAND gate 60-0 and the counter 111.

The operations during the test operation are similar to those described with reference to FIG. 5 and FIG. 6 according to the first embodiment. The difference from the first and second embodiments is only that one of the signal OSC_CLK_A fed back from the input buffer 67 and the signal OSC_CLK_B fed back from the pre-driver replica 68 is selected based on the signal OSC_MODE_SEL.

3.2 Advantageous Effects of Present Embodiment

As with the present embodiment, the first embodiment may be combined with the first example of the second embodiment. As a matter of course, the first embodiment may be combined with the second example of the second embodiment. This enables a feedback path to be selected depending on the situation, thereby realizing an appropriate timing control.

4. Fourth Embodiment

Next, a semiconductor memory device according to a fourth embodiment will be described. The present embodiment is configured in such a manner that the NAND gates 60-0 to 60-2 are provided between the input buffer 40 and the inverter 41. The following description will in principle concentrate on the features different from the first embodiment.

4.1 Configuration of Input/Output Circuit 110

The input/output circuit 110 according to the present embodiment is configured in such a manner that the input/output circuit 110 described in the first embodiment is provided with the select circuit 71 coupled to the input buffer 67, the NAND gates 60-0 to 60-2 of the input/output block 80-0 described in the first embodiment are provided between the input buffer 40 and the inverter 41, and the counter 111 is coupled to the select circuit 71.

The select circuit 71 receives the signals OSC_CLK[0] to OSC_CLK[7] fed back from the input buffer 67 of each of the input/output blocks 80-0 to 80-7. The select circuit 70 selects one of the signals OSC_CLK[0] to OSC_CLK[7], and outputs the selected signal to the NAND gate 60-0 and the counter 111. The signals DQS and /DQS may be input to the select circuit 71. The NAND gates 60-0 to 60-2 and the counter 111 are eliminated from each of the input/output blocks 80-0 to 80-7.

During the test operation, the select circuit 71 selects one of the signals OSC_CLK[0] to OSC_CLK[7] based on a signal from the sequencer 160, for example, of the NAND flash memory 100, and the selected signal is input to the NAND gate 60-0 and the counter 111. Then, the adjustment for an input/output block corresponding to the selected signal is performed.

The operations during the test operation are similar to those described with reference to FIG. 5 and FIG. 6 according to the first embodiment. The difference from the first embodiment is only that a logic operation by the NAND gates 60-0 to 60-2 is performed after the input buffer 40 and before the inverter 41.

4.2. Effects of Present Embodiment

The configuration according to the present embodiment enables the signal DQ to be fed back after the input buffer 40 and before the inverter 41. As a result, a delay in a signal generated in a wider range than that of the input/output blocks, for example, can be corrected, thereby realizing more accurate timing control of the signal DQ.

5. Modifications Etc

As described in the above, a semiconductor memory device according to the embodiments includes: a first delay circuit (61) configured to delay a first signal (CNT) and provide a variable delay time; a first select circuit (MUX 63) configured to select a second signal (DATA_E) or a third signal (DATA_O) based on the first signal (CNT) delayed by the first delay circuit (61); a first output buffer (66) configured to output a fourth signal (DQ) based on a signal selected by the first select circuit (MUX 63); a first output pad configured to externally output the fourth signal (DO); and a counter (111) configured to count a number of times the fourth signal (DQ) is output.

The above configuration enables the output timing of the signal DQ to be controlled for each of the input/output blocks, so that operation reliability of the semiconductor memory device can be improved. The embodiments are not limited to those described in the above, and various modifications can be made.

The above embodiments describe an example in which the period Δt measured by the timer circuit in step S19 in FIG. 5 is equal to the reference value Tref. However, even in the case of the period at being different from the reference value Tref in step S19, it suffices that its difference falls within a fixed allowable range.

The above embodiments describe an example in which an output of one inverter (for example, the inverter 47) is input to one input/output block (for example, the input/output block 80-0). However, an output of one inverter (for example, the inverter 47) may be input to two input/output blocks (for example, the input/output blocks 80-0 and 80-1).

The test operation according to the above embodiments may be performed not only during a test process of a wafer but also after shipment. It is also considered that a timing may be deviated along with deterioration in various elements. In such a case, a similar operation to those in the above embodiments may be performed to adjust a delay time of the delay circuit 61. Then, data within the ROM fuse may be rewritten.

Figure 12A:
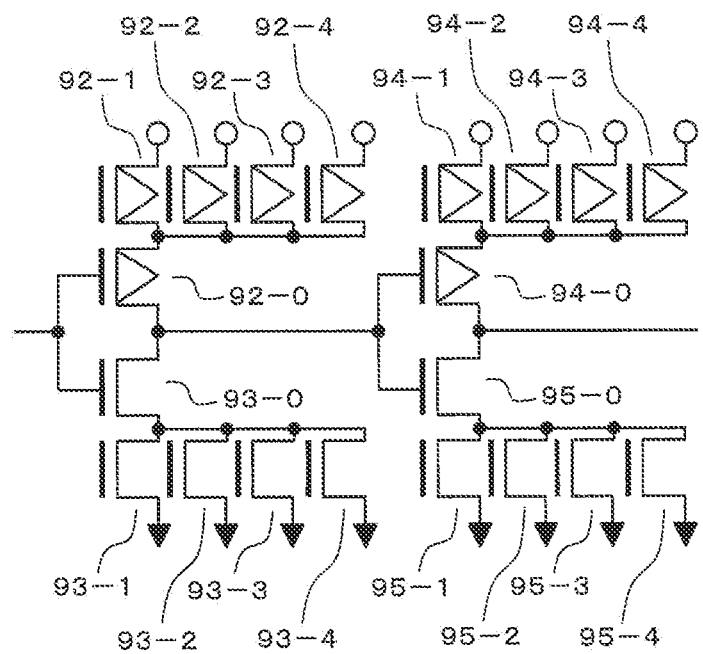
FIG. 12A is a circuit diagram showing a first modification of a delay circuit in the input/output circuit.
Figure 12B:
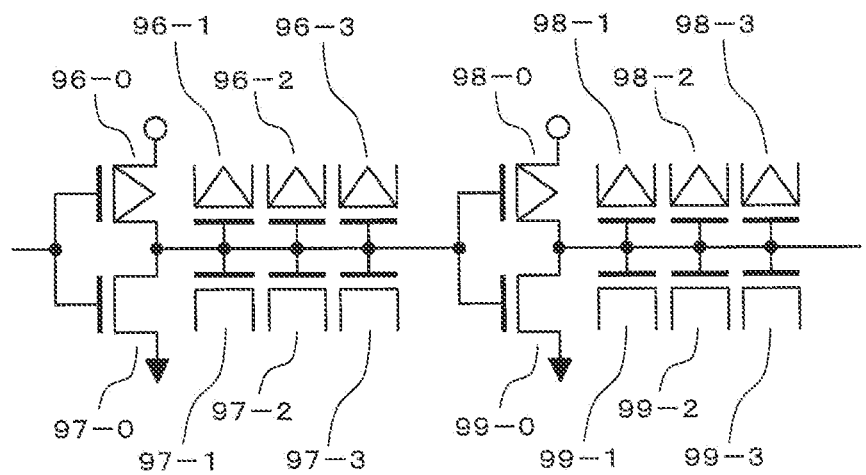
FIG. 12B is a circuit diagram showing a second modification of the delay circuit in the input/output circuit.

The delay circuit 61 in the input/output circuit 110 may be a circuit shown in, for example, FIG. 12A and FIG. 12B. Hereinafter, the circuits shown in FIG. 12A and FIG. 12B will be described.

FIG. 12A is a first modification of the delay circuit 61. The delay circuit 61 in FIG. 12A includes a plurality of p-channel MOS transistors and n-channel MOS transistors and adjusts a driving force depending on how many of these transistors are turned on, thereby adjusting a delay. As shown in FIG. 12A, the delay circuit 61 includes p-channel MOS transistors 92-0 to 92-4 and 94-0 to 94-4, and n-channel MOS transistors 93-0 to 93-4 and 95-0 to 95-4. An output of the NAND gate 60-2 is coupled to gates of the transistors 92-0 and 93-0. A source of the transistor 92-0 is coupled in parallel to drains of the transistors 92-1 to 92-4, and sources of the transistors 92-1 to 92-4 are each coupled to the power supply voltage. A source of the transistor 93-0 is coupled in parallel to drains of the transistors 93-1 to 93-4, and sources of the transistors 93-1 to 93-4 are each grounded. A drain of the transistor 92-0 is coupled to each of the drain of the transistor 93-0 and gates of the transistors 94-0 and 95-0. A source of the transistor 94-0 is coupled in parallel to drains of the transistors 94-1 to 94-4, and sources of the transistors 94-1 to 94-4 are each coupled to the power supply voltage. A source of the transistor 95-0 is coupled in parallel to drains of the transistors 95-1 to 95-4, and sources of the transistors 95-1 to 95-4 are each grounded. A drain of the transistor 94-0 is coupled to each of the drain of the transistor 95-0 and the MUX 63.

FIG. 12B is a second modification of the delay circuit 61. The delay circuit 61 in FIG. 12B is configured to have each transistor coupled as a capacitance to an output node and to set a capacitance value variable by adjusting voltages of a source and a drain to thereby adjust a delay. As shown in FIG. 12B, the delay circuit 61 includes p-channel MOS transistors 96-0 to 96-3 and 98-0 to 98-3, and n-channel MOS transistors 97-0 to 97-3 and 99-0 to 99-3. An output of the NAND gate 60-2 is coupled to gates of the transistors 96-0 and 97-0. A source of the transistor 96-0 is coupled to a power supply voltage, and a source of the transistor 97-0 is grounded. A drain of the transistor 96-0 is coupled to each of the drain of the transistor 97-0 and gates of transistors 96-1 to 96-3, 97-1 to 97-3, and 98-0 to 99-0. A source of the transistor 98-0 is coupled to a power supply voltage, and a source of the transistor 99-0 is grounded. A drain of the transistor 98-0 is coupled to each of the drain of the transistor 99-0, gates of the transistors 98-1 to 98-3 and 99-1 to 99-3, and the MUX 63.

Furthermore, each of the above embodiments is independently implementable without depending on another embodiment. On the other hand, the above embodiments are each combinable.

In addition, described in the above embodiments was the case in which a NAND flash memory is used as an example of a semiconductor memory device. However, the embodiments are applicable to all other types of a semiconductor memory in addition to a NAND flash memory, and are further applicable to various types of a memory device other than a semiconductor memory. In the flowcharts described in the above embodiments, the order of processing may be shuffled to the extent possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a first delay circuit configured to delay a first signal and provide a variable delay time;
   a first select circuit configured to select a second signal or a third signal based on the first signal delayed by the first delay circuit;
   a first circuit configured to output a fourth signal based on a signal selected and output by the first select circuit;
   a first output buffer configured to output a fifth signal based on the signal selected and output by the first select circuit;
   a first output pad configured to externally output the fifth signal; and a counter configured to count a number of times the fourth signal is output.

2. The semiconductor memory device according to claim 1, further comprising a first driver circuit configured to shape a waveform of the signal selected and output by the first select circuit,
wherein the first circuit includes a second driver circuit configured to shape a waveform of the signal selected and output by the first select circuit.

3. The semiconductor memory device according to claim 1, wherein the first circuit includes a second output buffer configured to output the fourth signal based on the signal selected and output by the first select circuit.

4. The semiconductor memory device according to claim 1, further comprising:
a first interconnect configured to feed back, as the first signal, a sixth signal based on the fourth signal to the first delay circuit;
a second interconnect configured to feed back, as the first signal, a seventh signal based on the fifth signal to the first delay circuit; and
a second select circuit configured to select the first interconnect or the second interconnect,
wherein the counter is configured to count a number of times the fourth signal is output when the second select circuit selects the first interconnect, and to count a number of times the fifth signal is output when the second select circuit selects the second interconnect.

5. The semiconductor memory device according to claim 1, further comprising a plurality of input/output blocks,
wherein each of the plurality of input/output blocks includes: the first delay circuit, the first select circuit, the first circuit, the first output buffer, the first output pad, and the counter, and
the delay time is controllable for each of the input/output blocks.

* * * * *